(12) United States Patent
Clark et al.

(10) Patent No.: US 7,010,706 B2
(45) Date of Patent: Mar. 7, 2006

(54) APPARATUS HAVING A FIRST CIRCUIT SUPPLYING A POWER POTENTIAL TO A SECOND CIRCUIT UNDER A FIRST OPERATING MODE OTHERWISE DECOUPLING THE POWER POTENTIAL

(75) Inventors: Lawrence T. Clark, Phoenix, AZ (US); Neil F. Deutscher, Tempe, AZ (US); Eric J. Hoffman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 645 days.

(21) Appl. No.: 09/834,408

(22) Filed: Apr. 13, 2001

(65) Prior Publication Data

US 2002/0152410 A1 Oct. 17, 2002

(51) Int. Cl.
 *G06F 1/26* (2006.01)

(52) U.S. Cl. .................... 713/320; 713/323; 713/324
(58) Field of Classification Search ............... 713/320, 713/324, 323, 321
 See application file for complete search history.

(56) References Cited

U.S. PATENT DOCUMENTS 5,596,286 A * 1/1997 Houston ..................... 326/33
6,064,223 A * 5/2000 Lu et al. ..................... 326/21
6,208,171 B1   3/2001 Kumagai et al.
6,246,265 B1 * 6/2001 Ogawa ....................... 326/95
6,256,252 B1 * 7/2001 Arimoto ..................... 365/227
6,313,695 B1 * 11/2001 Ooishi et al. ............... 327/544

FOREIGN PATENT DOCUMENTS

FR        2772217        6/1999
JP        2001093275 A * 4/2001

OTHER PUBLICATIONS

IBM, Efficient Power–Supply Decoupling Scheme for Dynamic Rams, May 1, 1991, vol. 33, Issue 12, pp. 439–441.*

Copy of PCT Search Report. Apr. 7, 2003.

* cited by examiner

*Primary Examiner*—Thomas Lee
*Assistant Examiner*—Suresh K Suryawanshi
(74) *Attorney, Agent, or Firm*—Lanny L. Parker

(57) ABSTRACT

Briefly, in accordance with one embodiment of the invention, an integrated circuit has a voltage regulator that is used to provide a power supply potential to a memory circuit while a logic circuit is decoupled from a power supply potential.

18 Claims, 3 Drawing Sheets

APPARATUS HAVING A FIRST CIRCUIT SUPPLYING A POWER POTENTIAL TO A SECOND CIRCUIT UNDER A FIRST OPERATING MODE OTHERWISE DECOUPLING THE POWER POTENTIAL

BACKGROUND

Advances in manufacturing techniques have allowed transistors to be made with ever smaller geometries. For example, photolithographic and etch techniques have improved to the point where transistors with a gate length of 0.25 microns ($\mu$m) may be made. Decreasing the size of transistors is generally perceived to be beneficial because this may allow more transistors to be made within the same amount of area on a semiconductor die.

It may also be generally beneficial to reduce the thickness of the gate dielectric material as the size of the transistor is reduced. Advancements in manufacturing capabilities may allow transistors to be made that have gate dielectric layers measured in monolayers (i.e. layers or atoms). However, as the thickness of the dielectric material is reduced, the leakage current through the material may increase. Thus, the amount of current leakage through the gate of each transistor may increase. This problem may be further acerbated by the trend to increase the number of transistors that make up an integrated circuit.

Thus, there is a continuing need to reduce the leakage current associated with a transistor in an integrated circuit.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
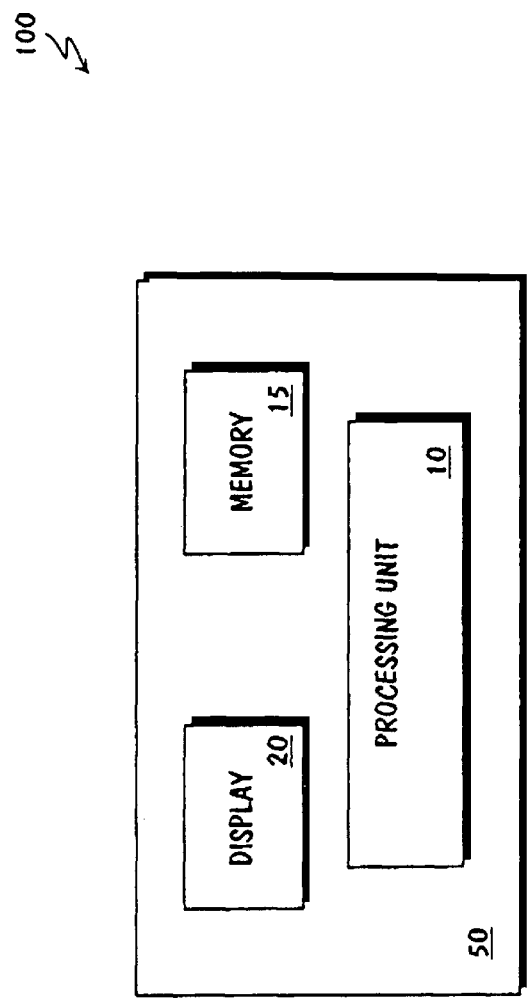
FIG. 1 is a block diagram of a computing system in accordance with an embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. Note, in this description a "#" symbol is used to indicate the logical complement of a signal. For example, if BL is a logic "1," then BL# is a logic "0," although this invention is not limited to any particular signaling scheme.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

It should be understood that embodiments of the present invention may be used in a variety of applications. Although the present invention is not limited in this respect, the circuits disclosed herein may be used in many apparatuses such as in the transmitters and receivers of a radio system. Radio systems intended to be included within the scope of the present invention include, by way of example only, cellular radiotelephone communication systems, satellite communication systems, two-way radio communication systems, one-way pagers, two-way pagers, personal communication systems (PCS), personal digital assistants (PDA's) and the like.

Types of cellular radiotelephone communication systems intended to be within the scope of the present invention include, although not limited to, Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

Turning to FIG. 1, an embodiment 100 in accordance with the present invention is described. Embodiment 100 may comprise a computing system 50 such as, for example, a portable device such as a mobile communication device (e.g., cell phone), a two-way radio communication system, a one-way pager, a two-way pager, a personal communication system (PCS), a portable computer, or the like. Although it should be understood that the scope and application of the present invention is in no way limited to these examples.

Computing system 50 here includes a display 20 to provide information to a user, a memory 15, and a processing unit 10 that comprise one or more integrated circuits, although the scope of the present invention is not limited in this respect. Processing unit 10 may comprise, for example, a microprocessor, a digital signal processor, a microcontroller, or the like. Simply stated, processing unit may be used to execute instructions to provide information or communications to a user. Instructions to be executed by processing unit may be stored in memory 15, although the scope of the present invention is not limited in this respect. Memory 15 may comprise, for example, disk including floppy disks, optical disks, CD-ROMs, magnetic-optical disks, read-only memories (ROMs), random access memories (RAMs) such as dynamic RAM (DRAM) or static RAM (SRAM), electrically programmable read-only memories (EPROMs), electrically erasable and programmable read only memories (EEPROMs), magnetic or optical cards, or any other type of media suitable for storing electronic instructions.

Figure 2:
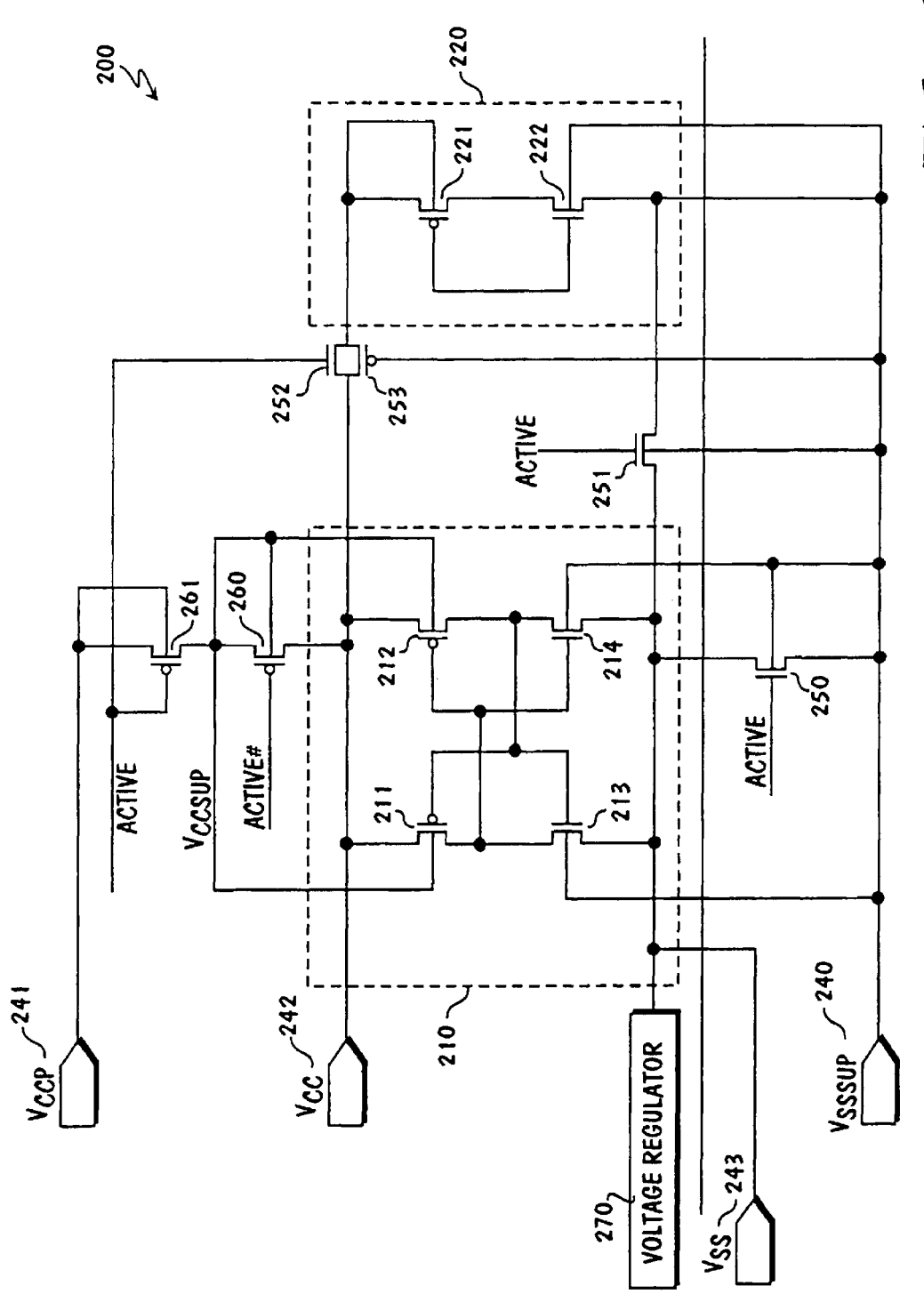
FIG. 2 is a schematic representation of a circuit in accordance with an embodiment of the present invention.

Turning to FIG. 2, an integrated circuit 200 that may be used to provide a portion of processing unit 10 (see FIG. 1) is described. Integrated circuit 10 may comprise a memory circuit 210 and a logic circuit 220. As explained in more detail below, particular embodiments may reduce the power consumption of processing unit 10 by decoupling or disconnecting a power supply potential from the portions of integrated circuit 10 while processing unit is an a stand-by or low power consumption mode of operation.

For ease of explanation, only a few transistors are shown within memory circuit 210 and logic circuit 220 so as not to obscure the present invention. It should be understood that memory circuit 210 and logic circuit 220 may comprise any number of transistors or sub-circuits. In the following description, a circuit or sub-circuit generally refers to a plurality of transistors, for example two or more. However, it should be understood that a single transistor may be a circuit or sub-circuit.

Although the scope of the present invention is not limited in this respect, memory circuit 210 may be a collection of transistors (i.e. transistors 211–214) that may be used to store a volatile memory state that may optionally comprise more than one bit. For example, memory circuit 210 may store logic values that are generated or stored while processing unit 10 is in operation. Such logic values are referred to as volatile because their value is typically lost when power is removed from processing unit 10 (e.g. the power supply potentials are removed from memory circuit 210 when computing system 50 is turned off).

Although the scope of the present invention is not limited in this respect, memory circuit 210 may be, for example, a portion of a DRAM, SRAM, latch, register, bus flip—flip, etc., that may store or provide a logic value to another portion of processing unit 10 (e.g. logic circuit 220). In addition to and optionally, memory circuit 210 may comprise all or part of the logic circuitry use to access and store volatile logic values. For example, in alternative embodiments, memory circuit 210 may comprise row/column decode circuitry, sense amp circuitry, bus circuitry, or any other logic circuitry that may be used for the operation of memory circuitry 210 and that should continue to be coupled to a power supply voltage potential while processing unit 10 is in a low power operational mode.

Although the scope of the present invention is not limited in this respect, memory circuitry 210 generally represents the portion of integrated circuit 200 (i.e. processing unit 10) that should be coupled to some power supply potential when processing unit is in a low power operational mode. In such a mode, processing unit may halt or slow down the execution of instructions in an attempt to reduce its power consumption. While in this operational mode, the power supply potentials may be applied to memory circuit 210 so that the volatile logic value is not lost or changed during this operational mode. Consequently, the data or logic value stored in memory circuit 210 may be used when processing unit 10 again changes operational modes and begins executing instructions.

Logic circuitry 220 may comprise transistors (e.g. transistors 221–222) and or other circuitry (for example, discrete devices) that may be used to generate logic values during while processing unit 10 is executing instructions. For example, logic circuitry 220 may comprise instruction decode circuitry, arithmetic logic units, multiplexors, encoders, combinational logic, etc., although the scope of the present invention is not limited so as to include any or all of these sub-circuits. In order to reduce the power consumption of integrated circuit 200, a power supply potential may be removed from logic circuitry 220 while processing unit 10 is in a low-power mode of operation. In this embodiment, logic circuitry 220 need not store any data or logic values, and thus, may be decoupled from the power supply potential without any adverse effects to processing unit 10.

While processing unit is in an operational mode where it is executing instructions, a power supply potential may be applied to integrated circuit 200, and more particularly, to memory circuit 210 and logic circuit 220. To do this, although the scope of the present invention is not limited in this respect, processing unit 10 may provide or generate an enable signal (labeled active and active# in FIG. 2) to integrated circuit 200. The enable signal may be used to indicate that processing unit is in a normal mode of operation. The enable signal, active, may be used to enable transistors 250–252, which, in turn, may couple memory circuit 210 and logic circuit 220 to a power supply potential.

When processing unit 10 is executing instructions (i.e. normal operational mode), memory circuit 210 may be connected to a power supply potential across power supply connections Vcc 242 and Vss 243. Although the scope of the present invention is not limited in this respect, the power supply potential may be less than 5 volts, for example, range from about 0.5 to 1 volt. Enable transistors 251–252 may couple logic circuit 220 to the power supply potential when turned on with the enable signal, active. Accordingly, both memory circuit 210 and logic circuit 220 may be coupled to the power supply potential. In addition, enable transistors 251–252 may also couple memory circuit 210 and logic circuit 220 to each other. In particular embodiments this may be desirable so that both circuits are operating with the substantially the same voltage potential. Additionally and optionally, integrated circuit 200 may include a pass transistor 253 coupled to the Vsssup power supply potential to help ensure that logic circuit 220 is coupled to the power supply potential Vcc 242 over any voltage potential rang of Vcc that may be used.

In alternative embodiments, enable transistors 250–252 may be manufactured so as to have a gate dielectric layer that is substantially thicker that the gate dielectric layer used to make up the transistors in memory circuit 210 or logic circuit 220. For example, enable transistors 250–252 may have a gate dielectric layer that is about 100–300 angstroms thick, whereas transistors 221–222 may have a gate dielectric layer that is about 5–50 angstroms thick. This arrangement may be desirable so that enable transistors 250–252 may be coupled to voltage potentials that might have a detrimental effect to the transistors with a thinner gate dielectric layer (e.g. transistors 211–214 or transistors 221–222). The thicker gate dielectric layer may also be desirable to reduce the amount of current that leaks through the gate of the transistors in integrated circuit 200. These "thick-gate" transistors (i.e. enable transistors 250–253) may also have a higher threshold voltage that may further reduce their leakage current.

Continuing with the embodiment shown in FIG. 2, when processing unit 10 changes its operational mode such as, for example, a stand-by or low power mode, portions of integrated circuit may be decoupled from the power supply potential. For example, if processing unit 10 is no longer executing instructions, then the power to the transistors of logic circuit 220 may be removed. By deasserting the enable signal active, logic circuit 220 may be decoupled from the power supply potential; although the scope of the present invention is not limited in this respect. By removing the power supply potential from the transistors of logic circuit 220 (e.g. transistors 221–222) the leakage current due to the leakage through the gate dielectric material of transistors 221–222 may be reduced. Removing the power supply potential may also reduce the source to drain leakage of the transistors.

When processing unit 10 is in a low-power operational mode, transistors 211–214 of memory circuit 210 may be coupled to a voltage regulator 270. As shown in FIG. 2, enable transistor 250 may be used to couple the Vss 243 connection to a Vsssup 240 connection. When processing unit 10 is in a low-power mode of operation, enable transistor 250 may disconnect or decouple memory circuit 210 and logic circuit 220 from a Vss potential. Consequently, voltage regulator 270 may be used to provide memory circuit 210 with a Vss potential that may allow memory circuit 210 to retain it volatile logic value while logic circuit 220 is decoupled from the power supply voltage potential. It should be understood that voltage regulator 270 need not provide a voltage potential that is the same or similar to the Vsssup 240 potential. In alternative embodiments, voltage regulator 270 may provide a voltage potential that is substantially higher than the Vsssup 240 potential. For example, voltage regulator 270 may provide a voltage potential that is 0.25–0.8 volts higher than the ground potential. When processing unit 10 returns to normal operation, voltage regulator 270 may be decoupled from integrated circuit and the Vss 243 voltage potential may be provided by the Vsssup 240 connections.

As shown in FIG. 2, some embodiments of the present invention may include transistors 260–261 that may be used to further reduce the amount of leakage current of integrated circuit 200 when it is in a low-power mode of operation, although the scope of the present invention is not limited so as to require their use. In this particular embodiment, three voltage potentials, such as Vsssup voltage potential 240, Vccp voltage potential 241, and Vcc voltage potential 242 may be selectively applied to portions of transistors 211–214 to reduce the leakage through their respective channel regions. As shown in FIG. 2, voltage potentials 240–243 may be provided by pads that may be connected to power supplies that are external to integrated circuit 200. However, this is not intended as a limitation of the scope of the present invention as voltage potentials 240–243 may be provided from power supplies located within integrated circuit 200 (e.g. from charge pumps or voltage dividers). Furthermore, in other embodiments, voltage potentials 240–242 may represent the voltage potential provided by the nodes of another circuit (not shown) or from other portions of integrated circuit 200.

As indicated in FIG. 2, a voltage potential (e.g., Vsssup 240) may be applied to the channel region of transistors 213–214 that is lower in magnitude than a voltage potential (e.g., a Vss potential) on the source region of transistors 213–214 (e.g. 0.5–0.8 v volts lower). By reverse biasing their channel region with respect to the source region, the leakage current across the channel regions of transistors 213–214 may be reduced. Although the scope of the present invention is not limited in this respect, a Vss Generator (not shown) may be used to provide the Vss voltage potential by altering the Vsssup voltage potential 240.

Additionally, a Vccsup generator (not shown) may be used to provide a voltage potential (e.g., Vccsup 241) to the channel regions of transistor 211–212 that is greater than the voltage potential applied to their source regions. This may reduce the amount of leakage across their channel regions. It should be understood that the scope of the present invention is not limited to integrated circuits that apply both Vccsup 241 and Vsssup 240 potentials. In alternative embodiments, only one of the two potentials may be applied in stand-by mode. Note that enable transistors 260–261 may be used to apply the appropriate potential to the body of transistors 211–214 when integrated circuit 200 is in a low-power mode of operation. Again the use of transistors 260–261 and voltage potentials to reverse bias transistors 211–214 when not is use should be considered optional and not a limitation of the present invention. Note, in the example shown, Vccp may be the input/output (I/O) voltage potential that may be substantially above the Vcc potential.

Figure 3:
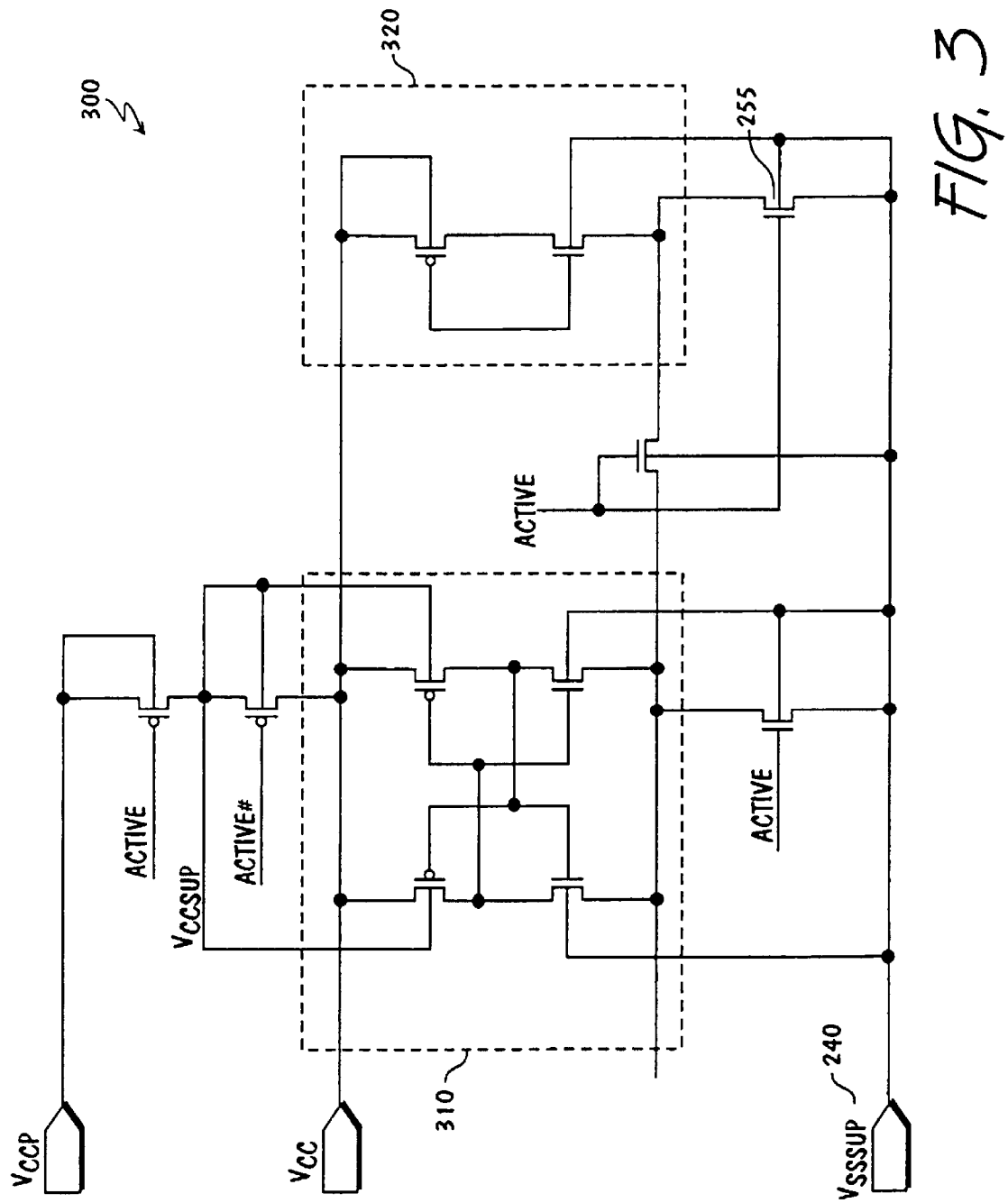
FIG. 3 is a schematic representation of a circuit in accordance with an alternative embodiment of the present invention.

Turning now to FIG. 3, an alternative embodiment of the present invention is described. Integrated circuit 300 is similar in some respects as integrated circuit 200 of FIG. 2. However, one notable difference is the use of an enable transistor 255 that may be used to couple logic circuit 320 to a power supply potential when integrated circuit 300 is in operation. Enable transistor 255 is in series between the transistors of logic circuit 320 and the power supply potential Vsssup 240. When processing unit 10 is executing instruction, it may assert the active signal, which, in turn, may couple the transistors of logic circuit 320 to Vsssup 240. When processing unit 10 transitions to a low-power mode of operation, active may be deasserted thereby decoupling the transistors from logic circuit 320. Note, in this embodiment enable transistors 252–253 are not used to couple/decouple logic circuit 320 from a power supply potential. However, in yet other embodiments, it may be desirable to include both transistors 252–253 and transistor 255. This particular embodiment may have an advantage of improved current drive in the coupling transistor 255.

By now it should be appreciated that the present invention provides circuits and methods by which the leakage current of an integrated circuit may be reduced. In particular embodiments, a power supply potential may be removed from some transistors of an integrated circuit so that the leakage current associated with those transistors may be reduced. While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus having an integrated circuit, the integrated circuit comprising;
    a first circuit having a power supply potential and adapted to store a volatile logic value; and
    a second circuit adapted to generate a logic value when coupled to receive the power supply potential from the first circuit in a first operational mode and decoupled from receiving the power supply potential when the first circuit is not in the first operational mode.

2. The apparatus of claim 1, wherein the integrated circuit further comprises a coupling transistor to couple and decouple the second circuit from the power supply potential.

3. The apparatus of claim 2, wherein the coupling transistor is in series between the second circuit and a node to be coupled to the power supply potential.

4. The apparatus of claim 2, wherein the second circuit comprises a logic transistor having a gate dielectric layer that is thinner than a gate dielectric layer of the coupling transistor.

5. The apparatus of claim 4, wherein the gate dielectric layer of the logic transistor is at least 30 angstroms thinner than the gate dielectric layer of the coupling transistor.

6. The apparatus of claim 2, wherein the integrated circuit further comprises a pass transistor connected in parallel with the coupling transistor, the pass transistor being of the opposite polarity as the coupling transistor.

7. The apparatus of claim 1, wherein the integrated circuit further comprises a voltage regulator and the integrated circuit is adapted to couple the first circuit to the voltage regulator in the first operational mode.

8. The apparatus of claim 7, wherein the integrated circuit is adapted to decouple the power supply potential from the first circuit when in a second operational mode.

9. The apparatus of claim 1, wherein the second circuit is adapted to generate the logic value based at least in part on the volatile logic value.

10. The apparatus of claim 1, wherein the integrated circuit is further adapted to couple the first circuit and the second circuit to the power supply potential in a second operational mode.

11. The apparatus of claim 10, wherein the integrated circuit is further adapted to couple the first circuit and the second circuit to each other in the second operational mode.

12. A method comprising:
supplying a power supply voltage potential to a memory circuit;
coupling the power supply voltage potential from the memory circuit to a logic circuit when an integrated circuit is in a first operational mode; and
retaining a volatile logic value in the memory circuit while decoupling the power supply voltage potential from the logic circuit when the integrated circuit is in a second operational mode.

13. The method of claim 12, further comprising coupling the memory circuit to a voltage regulator when the integrated circuit is in the second operational mode.

14. The method of claim 12, further comprising generating a logic value with the logic circuit based, at least in part, on a volatile logic value stored in the memory circuit when the integrated circuit is in the first operational mode.

15. A computing system comprising:
a static random access memory; and
an instruction processing unit, the instruction processing unit comprising:
a first circuit to receive a power supply potential and store a volatile logic value; and
a second circuit coupled to the first circuit to receive the power supply potential in a first operational mode and generate a logic value, wherein the instruction processing unit decouples the power supply potential from at least a portion of the second circuit in a second operational mode and the first circuit retains the volatile logic value.

16. The computing system of claim 15, wherein the instruction processing unit further comprises a coupling transistor to couple and decouple the second circuit from the power supply potential.

17. The computing system of claim 15, further comprises a voltage regulator, wherein the instruction processing unit is adapted to couple the first circuit to the voltage regulator in the first operational mode.

18. The computing system of claim 17, wherein the instruction processing unit is adapted to decouple the power supply potential from the first circuit when in the second operational mode.

* * * * *